US012593513B2

(12) United States Patent
Zhou et al.

(10) Patent No.: US 12,593,513 B2
(45) Date of Patent: Mar. 31, 2026

(54) SEMICONDUCTOR SUBSTRATE, TREATING METHOD THEREOF, SOLAR CELL AND PREPARATION METHOD THEREOF

(71) Applicant: ANHUI HUASUN ENERGY CO., LTD., Xuancheng (CN)

(72) Inventors: Xiwei Zhou, Xuancheng (CN); Liang Zhang, Xuancheng (CN); Jing Zhang, Xuancheng (CN); Ze Zhao, Xuancheng (CN)

(73) Assignee: ANHUI HUASUN ENERGY CO., LTD., Xuancheng (CN)

( * ) Notice: Subject to any disclaimer, the term of this patent is extended or adjusted under 35 U.S.C. 154(b) by 22 days.

(21) Appl. No.: 18/698,738

(22) PCT Filed: Dec. 23, 2022

(86) PCT No.: PCT/CN2022/141509
§ 371 (c)(1),
(2) Date: Apr. 4, 2024

(87) PCT Pub. No.: WO2024/092989
PCT Pub. Date: May 10, 2024

(65) Prior Publication Data
US 2025/0241071 A1     Jul. 24, 2025

(30) Foreign Application Priority Data
Nov. 4, 2022     (CN) .......................... 202211378975.9

(51) Int. Cl.
H10F 10/14          (2025.01)
H10F 71/00          (2025.01)
(Continued)

(52) U.S. Cl.
CPC ......... H10F 10/14 (2025.01); H10F 71/1224 (2025.01); H10F 71/128 (2025.01);
(Continued)

(58) Field of Classification Search
None
See application file for complete search history.

(56) References Cited

U.S. PATENT DOCUMENTS

2014/0020752 A1     1/2014  Arimoto et al.
2015/0380599 A1*  12/2015  Smith ................... H10F 77/707
                                                                438/97
(Continued)

FOREIGN PATENT DOCUMENTS

CN          101807616 A        8/2010
CN          105185849 A       12/2015
(Continued)

OTHER PUBLICATIONS

International Search Report and Written Opinion of the International Searching Authority for PCT Patent application No. PCT/CN2022/141509.
(Continued)

*Primary Examiner* — Eli S Mekhlin
(74) *Attorney, Agent, or Firm* — Maschoff Brennan

(57)          ABSTRACT
Disclosed are a semiconductor substrate and a treating method thereof, a solar cell and a preparation method thereof. The method for treating a semiconductor substrate includes forming a smooth surface area and a textured surface area adjacent to the smooth surface area on at least one side of the semiconductor substrate. The area of the smooth surface area is greater than or equal to that of the textured surface area. A smooth surface area and a textured surface area adjacent to the smooth surface area are formed on at least one side of the semiconductor substrate, so that the transparent conductive film is located and only located on the smooth surface area. A grid line is formed on the side of the corresponding to the transparent conductive film facing away from the semiconductor substrate, thereby
(Continued)

improving the photovoltaic conversion efficiency of the solar cell.

13 Claims, 6 Drawing Sheets

(51) Int. Cl.
    *H10F 77/20*        (2025.01)
    *H10F 77/70*        (2025.01)

(52) U.S. Cl.
    CPC ......... *H10F 77/244* (2025.01); *H10F 77/703* (2025.01); *H10F 77/707* (2025.01)

(56) References Cited

U.S. PATENT DOCUMENTS

| | | |
|---|---|---|
| 2017/0077322 A1 | 3/2017 | Westerberg et al. |
| 2021/0305307 A1 | 9/2021 | Huang |
| 2024/0014333 A1 | 1/2024 | Wu et al. |

FOREIGN PATENT DOCUMENTS

| | | | | |
|---|---|---|---|---|
| CN | 110534595 | A | 12/2019 | |
| CN | 111540797 | A | 8/2020 | |
| CN | 111628049 | A | 9/2020 | |
| CN | 111628050 | A | 9/2020 | |
| CN | 112466968 | A | 3/2021 | |
| CN | 113328012 | A | 8/2021 | |
| CN | 113421943 | A | 9/2021 | |
| CN | 114497288 | A | 5/2022 | |
| CN | 216624298 | U | 5/2022 | |
| CN | 216624299 | U | 5/2022 | |
| CN | 114843368 | A | 8/2022 | |
| CN | 115548144 | A | 12/2022 | |
| EP | 4394894 | A1 | 7/2024 | |
| JP | 2011523231 | A | 8/2011 | |
| JP | 2013187287 | A | 9/2013 | |
| JP | 2018014537 | A | 1/2018 | |
| WO | WO-2009044996 | A1 * | 4/2009 | .......... H10F 77/488 |

OTHER PUBLICATIONS

First Office Action dated Feb. 8, 2024 for Chinese patent application No. 2022113789759.

Search Report dated Jan. 14, 2025 for European Patent application No. 22958961.9.

First Office Action dated Apr. 15, 2025 for JP Patent application No. 2024-510515.

* cited by examiner

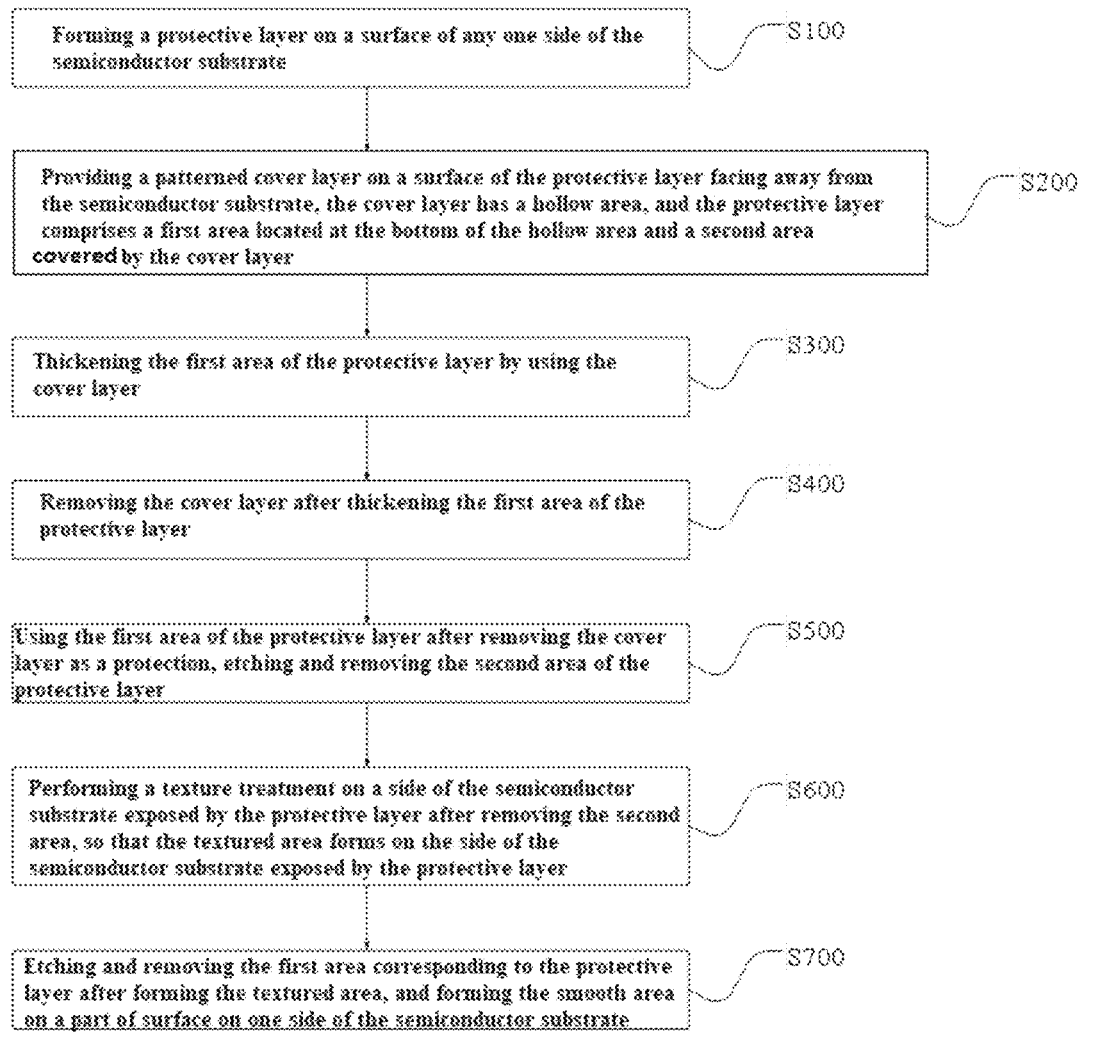

Forming a protective layer on a surface of any one side of the semiconductor substrate — S100

Providing a patterned cover layer on a surface of the protective layer facing away from the semiconductor substrate, the cover layer has a hollow area, and the protective layer comprises a first area located at the bottom of the hollow area and a second area covered by the cover layer — S200

Thickening the first area of the protective layer by using the cover layer — S300

Removing the cover layer after thickening the first area of the protective layer — S400

Using the first area of the protective layer after removing the cover layer as a protection, etching and removing the second area of the protective layer — S500

Performing a texture treatment on a side of the semiconductor substrate exposed by the protective layer after removing the second area, so that the textured area forms on the side of the semiconductor substrate exposed by the protective layer — S600

Etching and removing the first area corresponding to the protective layer after forming the textured area, and forming the smooth area on a part of surface on one side of the semiconductor substrate — S700

FIG. 1

SEMICONDUCTOR SUBSTRATE, TREATING METHOD THEREOF, SOLAR CELL AND PREPARATION METHOD THEREOF

The present application claims priority to Chinese Patent Application No. 202211378975.9, entitled "SEMICON-DUCTOR SUBSTRATE, TREATING METHOD THEREOF, SOLAR CELL AND PREPARATION METHOD THEREOF", and filed to the China National Intellectual Property Administration on Nov. 4, 2022, the entire contents of which are incorporated herein by reference.

TECHNICAL FIELD

The present disclosure relates to the technical field of solar cells, in particular to a semiconductor substrate and a treating method thereof, a solar cell and a preparation method thereof.

BACKGROUND

A solar cell is a device that absorbs sunlight and converts solar radiation energy directly or indirectly into electrical energy through the photoelectric effect or photochemical effect. Solar cells are a type of clean energy battery which are widely used in life and production.

One of semiconductor substrates commonly used in solar cells is a silicon substrate. In order to increase the light absorption capacity of the solar cell, texturing is usually performed on the surface of the silicon substrate to form a textured surface, which increases the light trapping capacity of the silicon substrate, thereby improving the photoelectric conversion efficiency of the solar cell. However, after the texturing process, densely arranged pyramidal structures will be formed on the surface of the silicon substrate. The height of these pyramidal structures can usually reach 1 $\mu$m to 2 $\mu$m, resulting in poor uniformity of other material layers formed in subsequent processes, making the opening voltage of the solar cell is reduced; in addition, the contact between the various material layers will also become worse, which will limit the transport of carriers and increase the series resistance, thus reducing the photoelectric conversion performance of solar energy.

It can be seen that how to improve the photoelectric conversion efficiency of solar cells is an urgent problem in the field of solar cells.

SUMMARY OF THE INVENTION

Therefore, the technical problem to be solved by the present application is to overcome the problem of low photoelectric conversion efficiency of solar cells in the prior art, thereby providing a semiconductor substrate and a treating method thereof, a solar cell and a preparation method thereof.

A first aspect of the present application provides method for treating a semiconductor substrate, comprising forming a smooth surface area and a textured surface area adjacent to the smooth surface area on at least one side of the semiconductor substrate, wherein the area of the smooth surface area is greater than or equal to that of the textured surface area.

Optionally, a ratio of the area of the smooth surface area to the area of the textured surface area is in a range of 1:1 to 1.2:1.

Optionally, the step of forming a smooth surface area and a textured surface area adjacent to the smooth surface area on any one side of the semiconductor substrate comprises: forming a protective layer on a surface of any one side of the semiconductor substrate; providing a patterned cover layer on a surface of the protective layer facing away from the semiconductor substrate, wherein the cover layer has a hollow area, and the protective layer comprises a first area located at the bottom of the hollow area and a second area covered by the cover layer; thickening the first area of the protective layer by using the cover layer; removing the cover layer after thickening the first area of the protective layer; using the first area of the protective layer after removing the cover layer as a protection, removing the second area of the protective layer by etching; performing a texture treatment on a side of the semiconductor substrate exposed by the protective layer after removing the second area, so that the textured surface area is formed on the side of the semiconductor substrate exposed by the protective layer; and removing the first area corresponding to the protective layer by etching after forming the textured surface area, so that the smooth surface area is formed on part of the surface on one side of the semiconductor substrate.

Optionally, the hollow area comprises at least a plurality of strip-shaped openings arranged at intervals, and the strip-shaped openings are parallel to each other.

Optionally, the step of forming a protective layer on the surface of any one side of the semiconductor substrate comprises: coating an entire underlying film on any one side of the semiconductor substrate; performing a diffusion annealing treatment on the underlying film, so that the underlying film reacts with one surface of the side of the semiconductor substrate to form the protective layer with doping ions, so that impurities inside the semiconductor substrate migrate to the protective layer.

Optionally, the step of thickening the first area of the protective layer comprises: using the cover layer as a mask, coating a top film on the surface of the first area; performing a diffusion annealing treatment to make the top film become part of the protective layer, thereby increasing the thickness of the first area.

Optionally, the cover layer comprises quartz material.

Optionally, the underlying film and the top film are liquid source films.

Optionally, the underlying film and the top film are phosphorus-containing liquid source films, and the phosphorus concentration of the top film is greater than that of the underlying film.

Optionally, a time period for performing diffusion annealing treatment on the top film is longer than a time period for performing diffusion annealing treatment on the underlying film.

Optionally, a temperature for a performing diffusion annealing treatment on the top film is greater than a temperature for a performing diffusion annealing treatment on the underlying film.

Optionally, in the steps of removing the first area of the protective layer by etching and removing the second area of the protective layer by etching, the parameters therefor comprise: a solution used for etching being a hydrofluoric acid aqueous solution, a mixture of a hydrochloric acid aqueous solution and water solvent, the mass concentration of the hydrofluoric acid aqueous solution being in a range from 35% to 50%, the mass concentration of the hydrochloric acid aqueous solution being in range from 30% to 50%, the volume ratio of the hydrofluoric acid aqueous solution being in a range from 1% to 4%, the volume ratio of the hydrochloric acid aqueous solution being in a range from 1% to 3%, and a time period for etching being in a range of 100 s to 300 s.

A second aspect of the present application provides a semiconductor substrate, wherein, at least one side of the semiconductor substrate has a smooth surface area and a textured surface area adjacent to the smooth surface area, and the area of the smooth surface area is greater than or equal to that of the textured surface area.

Optionally, a ratio of the area of the smooth surface area to the area of the textured surface area is in a range of 1:1 to 1.2:1.

A third aspect of the present application provides a method for preparing a solar cell, comprising providing a semiconductor substrate; treating the semiconductor substrate by using the above-mentioned method for treating a semiconductor substrate, so that at least one side of the semiconductor substrate has a smooth surface area and a textured surface area adjacent to the smooth surface area; forming a transparent conductive film on a side of the semiconductor substrate having a smooth surface area and a textured surface area, the transparent conductive film is located and only located on the smooth surface area; and forming a grid line on part of area of at least one side of the transparent conductive film facing away from the semiconductor substrate.

Optionally, the method for preparing a solar cell also comprises: forming a doped semiconductor layer on the side of the semiconductor substrate having the smooth surface area and the textured surface area before forming the transparent conductive film, the doped semiconductor layer is located between the semiconductor substrate and the transparent conductive film.

Optionally, an intrinsic semiconductor layer is formed on the side of the semiconductor substrate having the smooth surface area and the textured surface area before forming the doped semiconductor layer; and the intrinsic semiconductor layer is located between the semiconductor substrate and the doped semiconductor layer.

A fourth aspect of the present application provides a solar cell, comprising a semiconductor substrate, at least one side of the semiconductor substrate has a smooth surface area and a textured surface area adjacent to the smooth surface area, wherein the area of the smooth surface area is greater than or equal to that of the textured surface area; a transparent conductive film located on the side of the semiconductor substrate having the smooth surface area and the textured surface area, and only located on the smooth surface area; and a grid line located on at least part of area of the side of the transparent conductive film facing away from the semiconductor substrate.

Optionally, the solar cell further comprises: a doped semiconductor layer located between the semiconductor substrate and the transparent conductive film.

Optionally, the solar cell further comprises: an intrinsic semiconductor layer located between the semiconductor substrate and the doped semiconductor layer.

The technical solution of the present application can achieve the following beneficial effects:

1. In the present application, by treating the semiconductor substrate, at least one side of the surface of the semiconductor substrate comprises a smooth surface area and a textured surface area adjacent to the smooth surface area, wherein the textured surface area can provide excellent light trapping effect, the surface of the smooth surface area is smooth, which is conducive to the uniform deposition of other material layers in this area, thereby obtaining better uniformity of the material film layer, which is conducive to improving the photoelectric conversion efficiency and cell efficiency.

2. In the present application, by forming a protective layer on the surface of the semiconductor substrate, the impurity ions in the semiconductor substrate can migrate to the protective layer through diffusion annealing, thereby helping to reduce defects in the semiconductor substrate. After that, the cover layer is used to thicken the first area of the protective layer, and the impurity ions of the semiconductor substrate can continue to diffuse into the first area of the protective layer, which helps to further reduce the defects in the area of the semiconductor substrate corresponding to the first area of the protective layer. When the second area is removed by subsequent etching, at least part of the thickness of the first area of the protective layer is retained, ensuring that the area of the semiconductor substrate corresponding to the second area of the protective layer forms a textured surface area during the texturing process; the first area of the protective layer can protect the corresponding area of the semiconductor substrate from being etched, and then the first area of the protective layer is removed by etching, and the area of the semiconductor substrate corresponding to the first area of the protective layer forms a smooth surface area with a flat surface. Moreover, the impurity ion concentration in the smooth surface area of the semiconductor substrate is low, therefore the defect density of the semiconductor substrate is low.

3. The cover layer used in the present application is high-temperature-resistant quartz material, which is low in cost and can be reused after cleaning; in addition, the cover layer can protect the semiconductor substrate during the diffusion annealing process and reduce the risk of debris.

4. In the solar cell provided by the present application, the transparent conductive film and the grid lines are all located and only located on the smooth surface area. Since the surface of the smooth surface area is smooth, it is conducive to the uniform deposition of the transparent conductive film and the grid lines in the smooth surface area, and a flat surface area is conducive to sufficient contact between transparent conductive films and grid lines, thereby reducing series resistance; the textured surface area can provide excellent light trapping effect. The solar cell provided by the present application can simultaneously take into account the light trapping effect and low series resistance, which is beneficial to improving the photoelectric conversion efficiency of the solar cell.

BRIEF DESCRIPTION OF THE DRAWINGS

In order to illustrate the specific embodiments of the present application or the technical solutions in the prior art more clearly, the following briefly introduces the accompanying drawings that need to be used in the description of the specific embodiments or the prior art. Obviously, the accompanying drawings in the following description are some embodiments of the present application. For those of ordinary skill in the art, other drawings can also be obtained based on these drawings without creative efforts.

FIG. 1 is an exemplary flow chart of forming a smooth surface area and a textured surface area on one side of the semiconductor substrate according to an embodiment of the present application;

FIG. 2 to FIG. 10 are schematic structural diagrams during the processing of the semiconductor substrate according to an embodiment of the present application;

Figure 3:
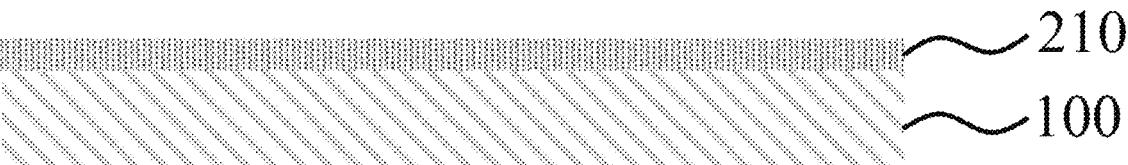

| Explanation of reference signs: | |
| --- | --- |
| 100-semiconductor substrate; | 101-semiconductor substrate; |
| 210-first protective layer; | 220-second protective layer; |
| 310-first area; | 320-third area; |
| 111-first textured surface area; | 112-the first smooth surface area; |
| 121-second textured surface area; | 122-the second smooth surface area; |
| 410-first intrinsic semiconductor layer; | 420-second intrinsic semiconductor layer; |
| 510-first doped semiconductor layer; | 520-second doped semiconductor layer; |
| 610-first transparent conductive film; | 620- second transparent conductive film; |
| 710-first grid line; | 720- second grid line; |
| 810-main body of the first cover; | 820-first hollow area. |

DETAILED DESCRIPTION

The technical solutions of the present application will be clearly and completely described below in conjunction with the drawings. Obviously, the described embodiments are some of the embodiments of the present application, not all of them. Based on the embodiments in this application, all other embodiments obtained by those skilled in the art without paying creative efforts belong to the scope of protection of the present application.

In the description of the present application, it should be noted that the terms "center", "upper", "lower", "left", "right", "vertical", "horizontal", "inner", "outer" etc. indicated orientation or positional relationship is based on the orientation or positional relationship shown in the drawings, and is only for the convenience of describing the present application and simplifying the description, rather than indicating or implying that the referred device or element must have a specific orientation, use a specific orientation construction and operation, therefore should not be construed as limiting the application. In addition, the terms "first", "second", and "third" are used for descriptive purposes only, and should not be construed as indicating or implying relative importance.

The technical features involved in the different embodiments of the present application described below may be combined as long as they do not constitute a conflict with each other.

One or more embodiments of the present application provide a method for treating a semiconductor substrate layer, comprising forming a smooth surface area and a textured surface area adjacent to the smooth surface area on at least one side of the semiconductor substrate; wherein the area of the smooth surface area is greater than or equal to that of the textured surface area.

In the present application, by treating the semiconductor substrate, at least one side of the surface of the semiconductor substrate comprises a smooth surface area and a textured surface area adjacent to the smooth surface area, wherein the textured surface area can provide excellent light trapping effect, the surface of the smooth surface area is smooth, which is conducive to the uniform deposition of other material layers in this area, which is conducive to improving the photoelectric conversion efficiency and cell efficiency.

In one embodiment, a ratio of the area of the smooth surface area to the area of the textured surface area is in a range of 1:1 to 1.2:1. For example, the ratio of the area of the smooth surface area to the area of the textured surface area is 1:1, 1.12:1, 1.15:1, 1.17:1 or 1.2:1.

In one embodiment, the step of forming a smooth surface area and a textured surface area adjacent to the smooth surface area on any one side of the semiconductor substrate comprises:

step S100: forming a protective layer on a surface of any one side of the semiconductor substrate;

step S200: providing a patterned cover layer on a surface of the protective layer facing away from the semiconductor substrate, wherein the cover layer has a hollow area, and the protective layer comprises a first area located at the bottom of the hollow area and a second area covered by the cover layer;

step S300: thickening the first area of the protective layer by using the cover layer;

step S400: removing the cover layer after thickening the first area of the protective layer;

step S500: using the first area of the protective layer after removing the cover layer as a protection, removing the second area of the protective layer by etching;

step S600: performing a texture treatment on a side of the semiconductor substrate exposed by the protective layer after removing the second area, so that the textured surface area is formed on the side of the semiconductor substrate exposed by the protective layer; and step S700: removing the first area corresponding to the protective layer by etching after forming the textured surface area, so that the smooth surface area is formed on part of the surface on one side of the semiconductor substrate.

In the present application, by forming a protective layer on the surface of the semiconductor substrate, the impurity ions in the semiconductor substrate can migrate to the protective layer, thereby helping to reduce defects in the semiconductor substrate. After that, the cover layer is used to thicken the first area of the protective layer, and the impurity ions of the semiconductor substrate can continue to diffuse into the first area of the protective layer, which helps to further reduce the defects in the area of the semiconductor substrate corresponding to the first area of the protective layer. When the second area is removed by subsequent etching, at least part of the thickness of the first area of the protective layer is retained, ensuring that the area of the semiconductor substrate corresponding to the second area of the protective layer forms a textured surface area during the texturing process; the first area of the protective layer can protect the corresponding area of the semiconductor substrate from being etched, and then the first area of the protective layer is removed by etching, and the area of the semiconductor substrate corresponding to the first area of the protective layer forms a smooth surface area with a flat surface. Moreover, the impurity ion concentration in the smooth surface area of the semiconductor substrate is low, therefore the defect density of the semiconductor substrate is low.

In one embodiment of the present application, the hollow area comprises at least a plurality of strip-shaped openings arranged at intervals, and the strip-shaped openings are parallel to each other. At this point, the hollow area can be used to prepare the main grid, forming a non-secondary grid electrode structure.

In one embodiment of the present application, the step of forming a protective layer on the surface of any one side of the semiconductor substrate comprises: coating an entire underlying film on any one side of the semiconductor substrate; and performing a diffusion annealing treatment on the underlying film, so that the underlying film reacts with one surface of the side of the semiconductor substrate to form the protective layer with doping ions, so that impurities inside the semiconductor substrate migrate to the protective layer.

It can be understood that performing diffusion annealing on the underlying film can accelerate the diffusion of impurity ions in the semiconductor substrate into the protective layer, and can make the reaction more complete.

In one embodiment, the step of thickening the first area of the protective layer comprises: using the cover layer as a mask, coating a top film on the surface of the first area; performing a diffusion annealing treatment to make the top film become part of the protective layer, thereby increasing the thickness of the first area.

It can be understood that the cover layer can limit the coating position and area of the top film, and the cover layer with different shapes and structures can be used according to specific application scenarios. The embodiments of the present application do not specifically limit the shape and structure of the cover layer.

In one embodiment, the cover layer comprises quartz material. The embodiments of the present application do not impose specific limitation on this, as long as the cover layer can not melt or deform under high temperature conditions.

In one embodiment, the underlying film and the top film are liquid source films. In other embodiments, the underlying film and the top film can also be formed by vapor deposition.

In one embodiment, the underlying film and the top film are phosphorus-containing liquid source films, and the phosphorus concentration of the top film is greater than that of the underlying film.

It can be understood that the protective layer has a loose structure, and the top film can penetrate into the protective layer formed by the underlying film, thereby reacting with the surface of the semiconductor substrate. In addition, the phosphorus concentration of the top film is greater than that of the underlying film, which facilitates the diffusion of phosphorus elements in the top film into the protective layer formed by the underlying film, so that the protective layer formed by the underlying film can continue to react with the semiconductor substrate.

In one embodiment, a time period for performing diffusion annealing treatment on the top film is longer than a time period for performing diffusion annealing treatment on the underlying film.

In one embodiment, a temperature for a performing diffusion annealing treatment on the top film is greater than a temperature for a performing diffusion annealing treatment on the underlying film.

In one embodiment, in the steps of removing the first area of the protective layer by etching and removing the second area of the protective layer by etching, the parameters therefor comprise: a solution used for etching being a hydrofluoric acid aqueous solution, a mixture of a hydrochloric acid aqueous solution and water solvent, the mass concentration of the hydrofluoric acid aqueous solution has a being in a range from 35% to 50%, the mass concentration of the hydrochloric acid aqueous solution being in a range from 30% to 50%, the volume ratio of the hydrofluoric acid aqueous solution being in a range from 1% to 4%, the volume ratio of the hydrochloric acid aqueous solution is in a range from 1% to 3%, and a time period for etching being in a range of 100 s to 300 s.

In one or more embodiments of the present application, the steps of forming a smooth surface area and a textured area adjacent to the smooth surface area on at least one side of the semiconductor substrate comprises: forming a first smooth surface area and a first textured area adjacent to the first smooth surface area on one side of the semiconductor substrate, wherein the area of the first smooth surface area is greater than or equal to that of the first textured area; and/or, forming a second smooth surface area and a second textured area adjacent to the second smooth surface area on the other side of the semiconductor substrate, wherein the area of the second smooth surface area is greater than or equal to that of the second textured area. In the following, an exemplary description will be given by taking the example of forming a first smooth surface area and a first textured area on one side of the semiconductor substrate, and forming a second smooth surface area and a second textured area on the other side of the semiconductor substrate, a detailed description of the method for treating a semiconductor substrate of the present application is described in detail.

The treating process of the semiconductor substrate will be described in detail below with reference to FIG. 2 to FIG. 10.

FIG. 2 shows an unprocessed semiconductor substrate 100 according to an embodiment of the present application.

The material of the semiconductor substrate 100 comprises microcrystalline silicon. In other embodiments, the material of the semiconductor substrate is other semiconductor materials, such as germanium or silicon germanium. The material of the semiconductor substrate can also be other semiconductor materials.

In this embodiment, the conductivity type of the semiconductor substrate 100 is N type, and the semiconductor substrate is used to prepare a solar cell.

Referring to FIG. 3, a first protective layer is formed on one side of the semiconductor substrate 100.

Specifically, an entire first underlying film is coated on one side of the semiconductor substrate and a first diffusion annealing treatment is performed, so that the underlying film is reacted with one side of semiconductor substrate to form the first protective layer with doping ions, so that impurities inside the semiconductor substrate migrate to the first protective layer.

Specifically, the first underlying film is liquid source film. In one embodiment, the first underlying film is a phosphorus-containing liquid source film.

Specifically, the first diffusion annealing treatment is a high temperature annealing treatment process. The semiconductor substrate 100 coated with the first underlying film is placed on an oven or a hot stage, and a baking treatment is performed, so that the phosphorus in the first underlying film can fully diffuse into the semiconductor substrate 100 and react with the impurities in the semiconductor substrate 100 to form the first protective layer 210 having a loose structure. Among them, the temperature of the baking treatment is in a range from 650° C. to 900° C., for example, the temperature is 650° C., 700° C., 800° C., 850° C. or 900° C.; the time of the baking treatment is in a range from 120 s to 1200 s, for example, the time is 120 s, 150 s, 200 s, 250 s, 300 s, 350 s, 400 s, 450 s, 500 s, 600 s, 700 s, 800 s, 900 s, 950 s, 1000 s, 1050 s, 1100 s, 1150 s or 1200 s.

Figure 4:
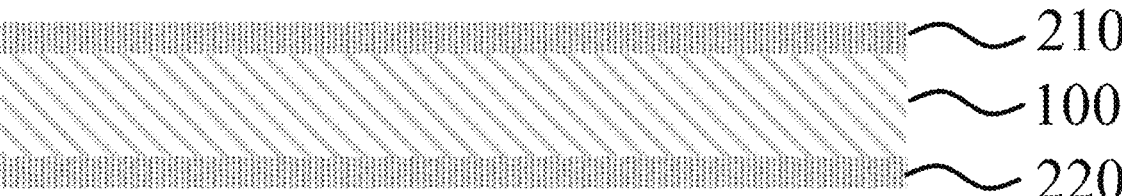

Referring to FIG. 4, a second protective layer is formed on the other side of the semiconductor substrate 100.

Specifically, an entire second underlying film is coated on the other side of the semiconductor substrate 100; the third diffusion annealing treatment is performed, so that the second underlying film is reacted with the other side of the semiconductor substrate to form the second layer with doping ions, so that impurities inside the semiconductor substrate migrate to the second protective layer.

Specifically, the second underlying film is a liquid source film, which is the same as or different from the first underlying film. In one embodiment, the second underlying film is the same as the first underlying film.

Specifically, the third diffusion annealing treatment is a high temperature annealing treatment process. It can be understood that the third diffusion annealing treatment is basically the same as the first diffusion annealing treatment in terms of process and effects, and will not be described again here.

Figure 5:
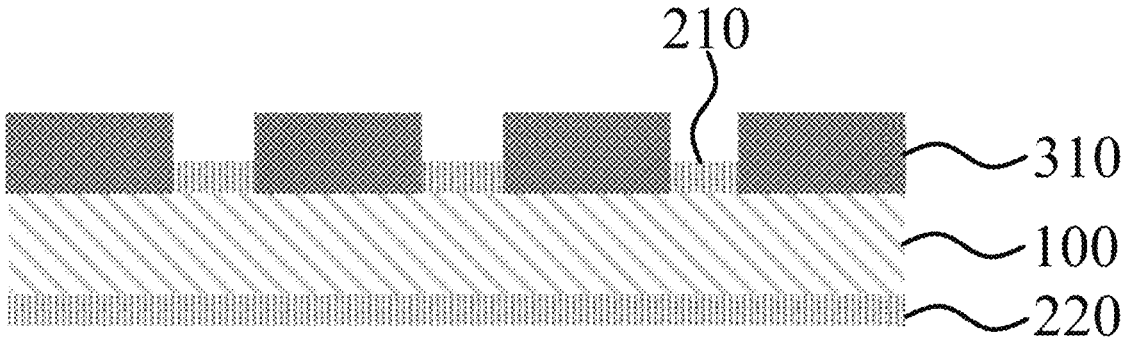

Referring to FIG. 5, a patterned first cover layer is provided on the surface of the first protective layer 210 facing away from the semiconductor substrate 100. The first cover layer has a first hollow area with several parallel strip-shaped openings. The first protective layer 210 comprises a first area 310 at the bottom of the first hollow area and a second area covered by the first cover layer; after setting the patterned first cover layer, the first area 310 of the first protective layer 210 is thickened.

Figure 11:
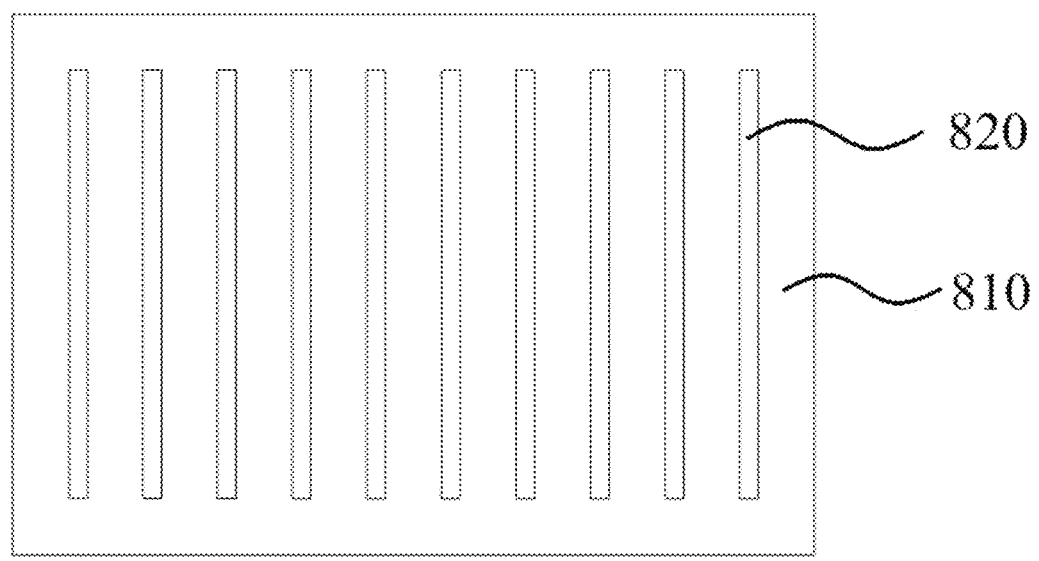
FIG. 11 is a schematic structural view of the cover layer of an example of the present application.

Specifically, referring to FIG. 11, the first cover layer comprises a first cover main body 810 and a first hollow area 820. In this embodiment, the first hollow area 820 is a hollow structure with several strip-shaped openings evenly distributed on the first cover main body 810, In other embodiments, the first hollow area 820 may also have other shapes, for example, the first hollow area is a network-shaped hollow structure regularly arranged on the first cover main body 810, which is suitable for forming a grid electrode structure including a main grid and a secondary grid. Multiple main grids are parallel to each other, the main grid is parallel to the main grid, the main grid and secondary grid are set vertically or at any angle, and the width and height of the secondary grid are respectively smaller than that of the main grid. In addition, the first hollow area can also be irregularly arranged or hollow structures with different shapes on the first cover main body 810, which is suitable for forming grid lines with special patterns. The shape and layout of the first hollow area 820 are consistent with the shape and layout of the grid lines of the finally formed solar cell. There is no limitation here on what kind of hollow structure the cover layer should have.

Specifically, a first top film is coated on the surface of the first area 310; and a second diffusion annealing treatment is performed so that the first top film becomes part of the first protective layer 210, thereby increasing the thickness of the first area 310. The first top film has the same composition as the first underlying film. It should be noted that the phosphorus concentration of the first top film is greater than that of the first underlying film, so that the phosphorus in the first top film can fully penetrate the first protective layer 210 and react with impurities in the semiconductor substrate 100.

In the above embodiment, since the first protective layer 210 has a loose structure, the first top film can directly penetrate into the surface of the semiconductor substrate 100 through the first area 310 of the first protective layer 210, and diffuse into the semiconductor substrate 100, to react with the impurities in the semiconductor substrate 100; in addition, the phosphorus in the first area 310 of the first protective layer 210 can still participate in the gettering reaction, providing a first top film with a higher concentration, which can supplement phosphorus for the first area 310 of the first protective layer 210, allowing the first area 310 of the first protective layer 210 to continue to react with impurities in the semiconductor substrate 100; finally, the thickness of the first area 310 of the first protective layer 210 is improved. It can be understood that part of the first top film can penetrate into the second are of the first protective layer 210, but the amount of the first top film that penetrates into this area is very small, and can be ignored compared to the first area 310 of the first protective layer 210.

Specifically, the second diffusion annealing treatment is a high temperature annealing treatment process. The process method of the second diffusion annealing treatment is the same as that of the first diffusion annealing treatment, with only differences in temperature and time. The temperature of the second diffusion annealing treatment is higher than that of the first diffusion annealing treatment, and the time of the second diffusion annealing treatment is longer than that of the first diffusion annealing treatment, so that the phosphorus of the first top film can fully penetrate the first protective layer 210 and react with impurities in the semiconductor substrate 100, and the reactivity of phosphorus in the first top film and phosphorus in the first protective layer 210 with impurities in the semiconductor substrate can be improved.

In one embodiment, the first cover layer is a quartz material. The first cover layer of quartz material is low in cost and can be reused after cleaning. At the same time, it can play a buffer role in the second diffusion annealing process to protect the semiconductor substrate 100 and reduce the risk of debris.

Specifically, after forming the first protective layer, a first cover layer is provided on the surface of the first protective layer facing away from the semiconductor substrate 100. During the subsequent second diffusion annealing process, the semiconductor substrate 100 can be protected due to the existence of the first cover layer.

Figure 6:
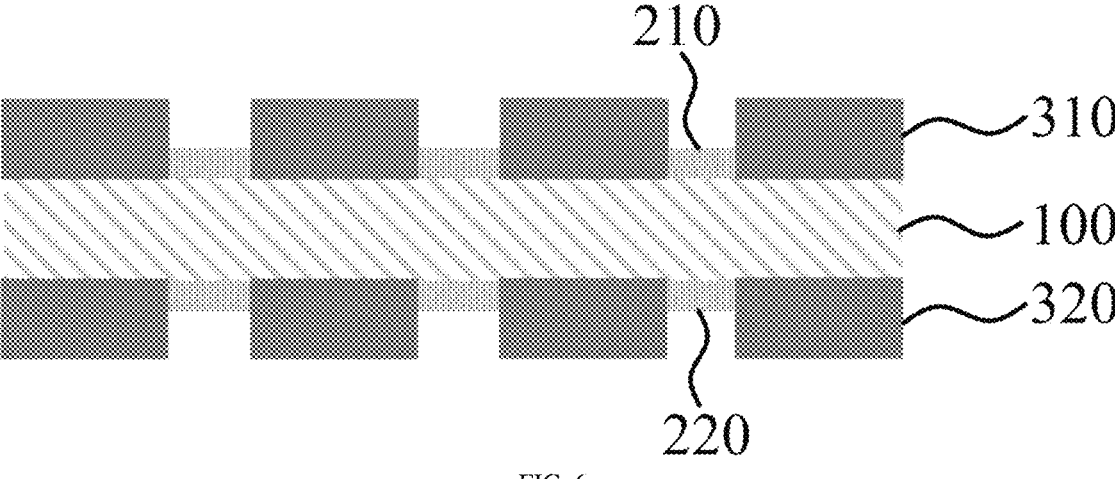

Referring to FIG. 6, a patterned second cover layer is provided on the surface of the second protective layer 220 facing away from the semiconductor substrate 100. The second cover layer has a second hollow area, and the second protective layer 220 comprises a third area 320 located at the bottom of the second hollow area and a fourth area covered by the second cover layer. After setting the patterned second cover layer, the third area 320 of the second protective layer 220 is thickened.

Specifically, according to specific application scenarios, the second cover layer is the same as or different from the first cover layer. The shape and layout of the second hollow area of the second cover layer are consistent with the shape and layout of the grid lines of the finally formed solar cell.

Specifically, a second top film is coated on the surface of the third area 320; and a fourth diffusion annealing treatment is performed so that the second top film becomes part of the first protective layer, thereby increasing the thickness to form the third area 320. The second top film has the same composition as the second underlying film. It should be noted that the phosphorus concentration of the second top film is greater than that of the second underlying film, so that the phosphorus in the first top film can fully penetrate the first protective layer 210 and react with impurities in the semiconductor substrate 100.

In the above embodiment, since the second protective layer 220 has a loose structure, the second top film can directly penetrate into the surface of the semiconductor substrate 100 through the third area 320 of the second protective layer 220, and diffuse into the semiconductor substrate 100, to react with the impurities in the semiconductor substrate 100; in addition, the phosphorus in the third area 320 of the second protective layer 220 can still participate in the gettering reaction, providing a second top film with a higher concentration, which can supplement phosphorus for the third area 320 of the protective layer 220, allowing the third area 320 of the second protective layer 220 to continue to react with the impurities in the semiconductor substrate 100; finally, the thickness of the third area 320 of the second protective layer 220 is improved. It can be understood that part of the second top film can penetrate into the fourth area of the second protective layer 220, but the amount of the second top film that penetrates into this area is very small, and can be ignored compared to the third area 320 of the second protective layer 220.

Specifically, the fourth diffusion annealing treatment is a high temperature annealing treatment process. The process method of the fourth diffusion annealing treatment is the same as that of the third diffusion annealing treatment, with only differences in temperature and time. The temperature of the fourth diffusion annealing treatment is higher than the temperature of the third diffusion annealing treatment, and the time of the fourth diffusion annealing treatment is longer than the time of the third diffusion annealing treatment, so that the phosphorus of the second top film can fully penetrate the second protective layer 220 and react with impurities in the semiconductor substrate 100, and the reactivity of phosphorus in the second top film and phosphorus in the second protective layer 220 with impurities in the semiconductor substrate can be improved.

In one embodiment, the second cover layer is a quartz material. The second cover layer of quartz material is low in cost and can be reused after cleaning. At the same time, it can play a buffer role in the fourth diffusion annealing process to protect the semiconductor substrate 100 and reduce the risk of debris.

In this embodiment, after performing the second diffusion annealing treatment, a second cover layer is provided on the surface of the second protective layer. During the fourth diffusion annealing treatment, the second cover layer is not removed and can continue to play a buffering role to protect the semiconductor layer substrate layer 100 and reduce the risk of debris.

Figure 7:
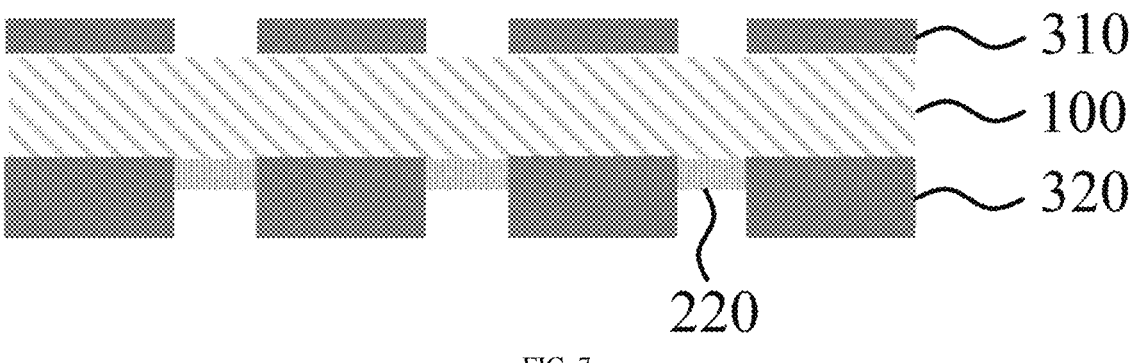

Referring to FIG. 7, after thickening the first zone 310 of the first protective layer 210, the first cover layer is removed. After removing the first cover layer, the first area 310 of the first protective layer 210 is used as a protection and the second area of the first protective layer 210 is removed by etching.

Specifically, the second area of the first protective layer 210 is removed by etching. The parameters therefor comprise: a solution used for etching being a hydrofluoric acid aqueous solution, a mixture of a hydrochloric acid aqueous solution and water solvent, the mass concentration of the hydrofluoric acid aqueous solution being in a range from 35% to 50%, the mass concentration of the hydrochloric acid aqueous solution being in a range from 30% to 50%, the volume ratio of the hydrofluoric acid aqueous solution being in a range from 1% to 4%, the volume ratio of the hydrochloric acid aqueous solution being in a range from 1% to 3%, and a time period for etching being in a range of 100 s to 300 s. For example, the parameters for removing the second area of the first protective layer 210 by etching comprise: a solution used for etching being an aqueous solution of 48% hydrofluoric acid and 37% hydrochloric acid, and the volume ratio of the aqueous hydrofluoric acid solution being 3% and the aqueous solution of hydrochloric acid, the volume ratio being 2%, and the time being 150 s.

Figure 8:
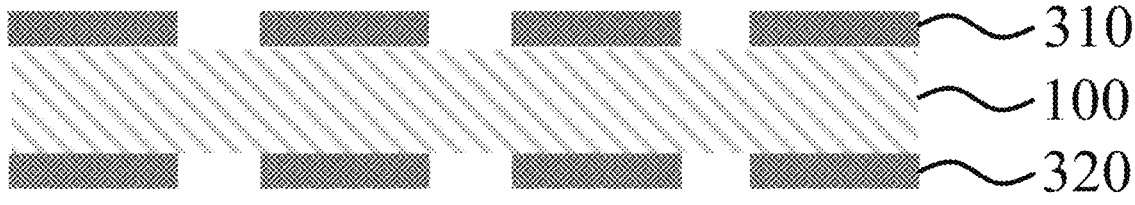

Referring to FIG. 8, after thickening the third area 320 of the second protective layer 220, the second cover layer is removed. After removing the second cover layer, the third area 320 of the second protective layer 220 is used as a protection to remove the fourth area of the second protective layer 220.

Specifically, the fourth area of the second protective layer 220 is removed by etching. The parameters of removing the fourth area of the second protective layer 220 by etching are the same as the aforementioned parameters of removing the second area of the first protective layer 210 by etching, which will not be described again here.

In this embodiment, the second area of the first protective layer 210 of the semiconductor substrate 100 is first removed by etching, and then the fourth area of the second protective layer 220 of the semiconductor substrate 100 is removed by etching. In another embodiment, the fourth area of the second protective layer 220 of the semiconductor substrate 100 is removed by etching first, and then the second area of the first protective layer 210 of the semiconductor substrate 100 is removed by etching. In yet another embodiment, the second area of the first protective layer 210 of the semiconductor substrate 100 and the fourth area of the second protective layer 220 of the semiconductor substrate 100 are removed by etching at the same time.

Figure 9:
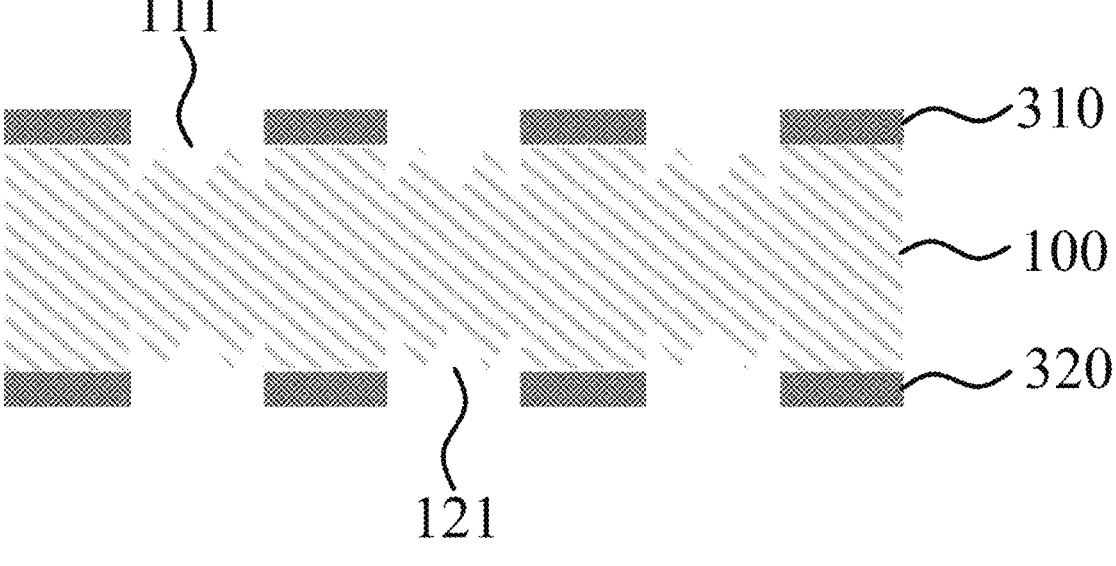

Referring to FIG. 9, the semiconductor substrate 100 exposed by the first area 310 is performed texturing treatment to form a first textured surface area 111 of the semiconductor substrate 100, and the semiconductor substrate 100 exposed by the third area 320 is performed texturing treatment to form a second textured surface area 121 of the semiconductor substrate 100. In one embodiment, the semiconductor substrate 100 exposed by the first area 310 is first performed texturing treatment to form the first textured surface area 111 of the semiconductor substrate 100, and then the semiconductor substrate 100 exposed by the third area 320 is performed texturing treatment to form a second textured surface area 121 of the semiconductor substrate 100. In another embodiment, the semiconductor substrate 100 exposed by the third area 320 is first is performed texturing treatment to form a second textured surface area 121 of the semiconductor substrate 100, and then the semiconductor substrate exposed by the first area 310 is performed texturing treatment to form a first textured surface area 111 of the semiconductor substrate 100. In yet another embodiment, the semiconductor substrate 100 exposed by the first area 310 is performed texturing treatment to form a first textured surface area 111 of the semiconductor substrate 100, while the semiconductor substrate 100 exposed by the third area 320 is performed texturing treatment to form a second textured surface area 121 of the semiconductor substrate 100.

Specifically, the texturing treatment comprises using a texturing agent. In one embodiment, the texturing agent is an aqueous solution of 2% to 5% potassium hydroxide. For example, the texturing agent is an aqueous solution of 2% potassium hydroxide, an aqueous solution of 3% potassium hydroxide, an aqueous solution of 4% potassium hydroxide, or an aqueous solution of 5% potassium hydroxide; the time of texturing treatment is in a range from 150 s to 300 s, exemplary, the time is 150 s, 180 s, 200, 250 s, 280 s or 300 s; the temperature is in a range from 60° C. to 70° C., exemplary, the temperature is 60° C., 62° C., 65° C., 67° C. or 70° C.

Figure 10:
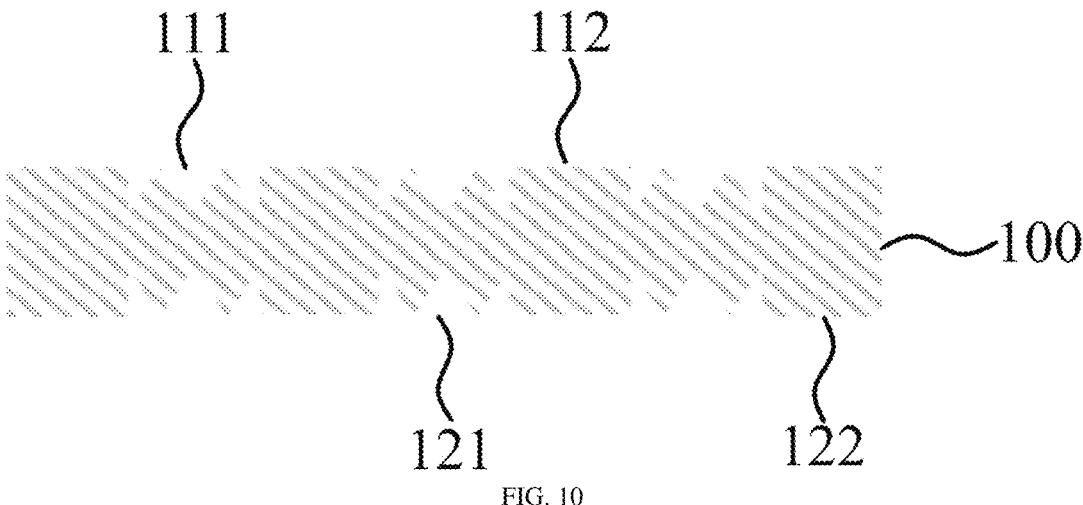

Referring to FIG. 10, the first area 310 is removed by etching to form the first smooth surface area 112 of the semiconductor substrate 100, and the third area 320 is removed by etching to form the second smooth surface area 122 of the semiconductor substrate 100. In one embodiment, the first area 310 is removed by etching to form the first smooth surface area 112 of the semiconductor substrate 100, and then the third area 320 is removed by etching to form the second smooth surface area 122 of the semiconductor substrate 100. In another embodiment, the third area 320 is first removed by etching to form the second smooth surface area 122 of the semiconductor substrate 100, and then the first area 310 is removed by etching to form the first smooth surface area 112 of the semiconductor substrate 100. In yet another embodiment, the first area 310 is removed by etching to form the first smooth surface area 112 of the semiconductor substrate 100, while the third area 320 is removed by etching to form the second smooth surface area 122 of the semiconductor substrate 100.

Specifically, the first area 310 and the third area 320 are removed by etching. The parameters of removing the first area 310 and the third area 320 are the same as the parameters of removing by etching the second area of the first protective layer 210 and the parameters of removing by etching the fourth area of the second protective layer 220, which will not be described again here.

In other embodiments of the present application, one side of the semiconductor substrate 100 is processed to form a first smooth surface area 112 and a first textured surface area 111 adjacent to the first smooth surface area 112, and then the other side of the semiconductor substrate 100 is processed to form a second smooth surface area 122 and a second textured surface area 121 adjacent to the second smooth surface area 122.

Specifically, the first area 310 and the second area of the first protective layer 210 are formed on one side of the semiconductor substrate 100, and the first area 310 of the first protective layer 210 is used as a protection to remove the second area of the first protective layer 210 by etching. The semiconductor substrate 100 exposed by the first area 310 of the first protective layer 210 is performed texturing treatment to form the first textured surface area 111, and the first area 310 of the first protective layer 210 is removed by etching to form a smooth surface area 112. After that, the third area 320 and the fourth area of the second protective layer 220 are formed on the other side of the semiconductor substrate 100, and the third area 320 of the second protective layer 220 is used as a protection, and the fourth area of the second protective layer 220 is removed by etching. The semiconductor substrate 100 exposed by the third area 320 of the second protective layer 220 is performed texturing treatment to form the second textured surface area 121, and the third area 320 of the second protective layer 220 is removed by etching to form the second smooth surface area 122.

One or more embodiments of the present application also provide a semiconductor substrate, at least one side of the semiconductor substrate has a smooth surface area and a textured surface area adjacent to the smooth surface area, and the area of the smooth surface area is greater than or equal to that of the textured surface area.

Referring to FIG. 10, in one embodiment, one side of the semiconductor substrate 100 has a first smooth surface area 112 and a first textured surface area 111 adjacent to the first smooth surface area 112; and/or, the other side of the semiconductor substrate 100 has a second smooth surface area 122 and a second textured surface area 121 adjacent to the second smooth surface area 122.

It can be understood that the semiconductor substrate 100 in the above embodiment is prepared by the aforementioned method for treating a semiconductor substrate, and has the same beneficial effect, so it will not be described again here.

In one embodiment, the area of the first smooth surface area 112 is greater than or equal to that of the first textured surface area 111, for example, the ratio of the area of the first smooth surface area 112 to the area of the first textured surface area 111 is in a range of 1:1 to 1.2:1, for example, the ratio of the area of the first smooth surface area 112 to the area of the first textured surface area 111 is 1:1, 1.05:1, 1.1:1, 1.15:1 or 1.2:1; and/or, the area of the second smooth surface area 122 is greater than or equal to that of the second textured surface area 121, for example, the ratio of the area of the second smooth surface area 122 to the area of the second textured surface area 121 is in a range of 1:1 to 1.2:1, for example, the ratio of the area of the second smooth surface area 122 to the area of the second textured surface area 121 is 1:1, 1.05:1, 1.1:1, 1.15:1 or 1.2:1.

It can be understood that, in a solar cell, the first smooth surface area 112 or the second smooth surface area 122 corresponds to the transparent conductive film and the grid lines. Increasing the area of the first smooth surface area or the area of the second smooth surface area 122 can make the above functional layers fully contact, which is beneficial for reducing the series resistance in the solar cell, increasing the current, reducing unnecessary power loss, and improving the photovoltaic conversion performance of the solar cell. In addition, both the first smooth surface area 112 and the second smooth surface area 122 have flat surfaces, which are conducive to the uniform deposition of other material layers in this area. Moreover, the low concentration of impurity ions in the first smooth surface area 112 and the second smooth surface area 122 is beneficial for reducing the probability of photo-generated carriers being trapped by defects in the semiconductor substrate, thereby improving the photoelectric conversion efficiency.

One or more embodiments of the present application also provide a method for preparing a solar cell, comprising providing a semiconductor substrate; treating the semiconductor substrate by using the above-mentioned method for treating a semiconductor substrate, so that at least one side of the semiconductor substrate has a smooth surface area and a textured surface area adjacent to the smooth surface area; forming a transparent conductive film on a side of the semiconductor substrate having a smooth surface area and a textured surface area, wherein the transparent conductive film is located and only located on the smooth surface area; and forming a grid line on at least part of area of one side of the transparent conductive film facing away from the semiconductor substrate.

Specifically, the transparent conductive film is arranged opposite to the smooth surface area, that is, the area of the positive projection of the transparent conductive film on the textured surface area is zero.

In one embodiment, the method for preparing a solar cell further comprises: forming a doped semiconductor layer on the side of the semiconductor substrate having the smooth surface area and the textured surface area before forming the transparent conductive film, wherein the doped semiconductor layer is located between the semiconductor substrate and the transparent conductive film.

In one embodiment, an intrinsic semiconductor layer is formed on the side of the semiconductor substrate having the smooth surface area and the textured surface area before forming the doped semiconductor layer; and the intrinsic semiconductor layer is located between the semiconductor substrate and the doped semiconductor layer.

In the solar cell provided by the present application, the transparent conductive film and the grid lines are all located and only located on the smooth surface area. Since the surface of the smooth surface area is smooth, it is conducive to the uniform deposition of the transparent conductive film and the grid lines on the smooth surface area, and a flat surface area is conducive to sufficient contact between transparent conductive films and grid lines, thereby reducing series resistance; the textured surface area can provide excellent light trapping effect. The solar cell provided by the present application can simultaneously take into account the light trapping effect and low series resistance, which is beneficial to improving the photoelectric conversion efficiency of the solar cell.

It can be understood that the smooth surface area and the textured surface area can only be formed on any one surface the side of the semiconductor substrate, and then the solar cell can be prepared; the smooth surface area and the textured surface area can be formed on both sides of the semiconductor substrate, and then the solar cell can be prepared. Hereinafter, taking the formation of solar cells on both sides of the semiconductor substrate at the same time as an example, the method for preparing the solar cell of the present application will be described in detail.

The process for preparing the solar cell will be described in detail below with reference to FIG. 12 to FIG. 19.

Figure 12:
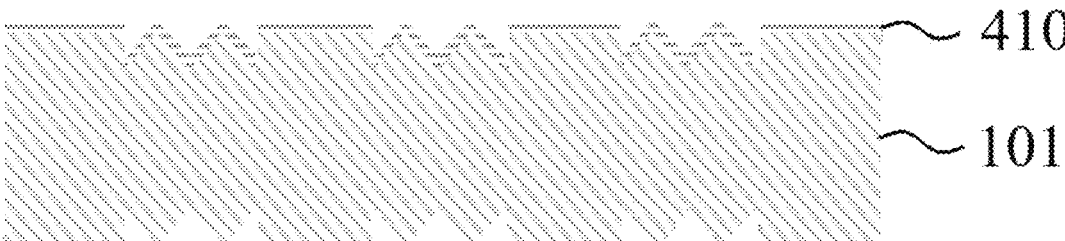
FIG. 12 to FIG. 19 are structural schematic diagrams during the preparation process of the solar cell according to an embodiment of the present application.
Figure 13:
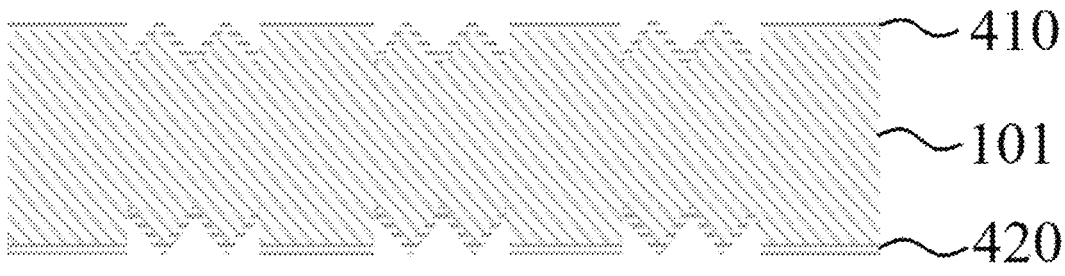

Referring to FIG. 12 and FIG. 13, a first intrinsic semiconductor layer 410 is formed on the side of the semiconductor substrate 101 having a first smooth surface area and a first textured surface area, and a second intrinsic semiconductor layer 420 is formed on the side of the semiconductor substrate 101 having a second smooth surface area and a second textured surface area. For example, the first intrinsic semiconductor layer 410 and the second intrinsic semiconductor layer 420 comprise amorphous silicon or microcrystalline silicon, which play a passivation role.

It can be understood that, since the first smooth surface area has a flat surface, the first intrinsic semiconductor layer 410 can be uniformly deposited on the first smooth surface area, thereby improving the uniformity of the first intrinsic semiconductor layer 410, thereby enhancing the passivation effect, and ultimately achieving the goal of improving the photovoltaic conversion efficiency of solar cells.

Figure 14:
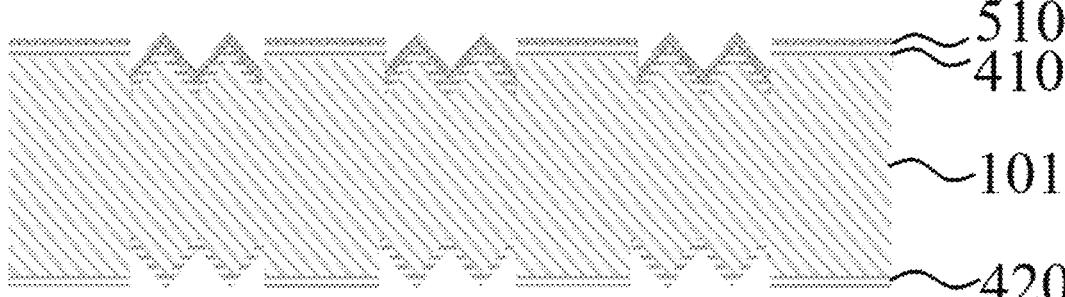
Figure 15:
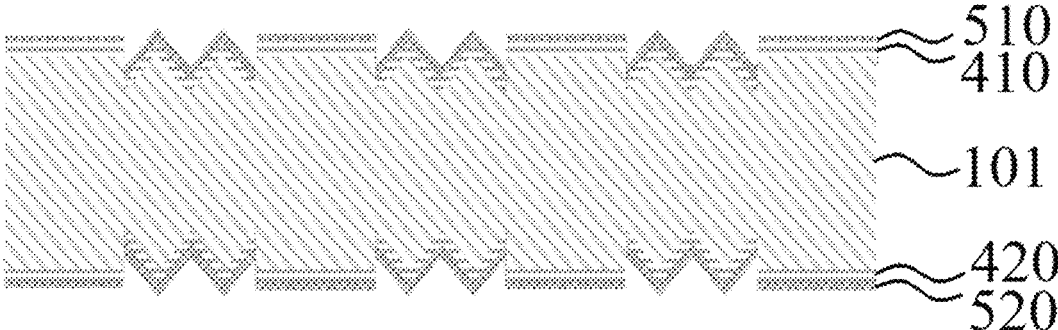

Referring to FIG. 14 and FIG. 15, a first doped semiconductor layer 510 is formed on the side of the first intrinsic semiconductor layer 410 facing away from the semiconductor substrate 101; a second doped semiconductor layer 520 is formed on the side of the second intrinsic semiconductor layer 420 facing away from the semiconductor substrate 101. For example, the first doped semiconductor layer 510 is N-type doped amorphous silicon or N-type doped microcrystalline silicon, the second doped semiconductor layer 520 is P-type doped amorphous silicon or P-type doped microcrystalline silicon, and vice versa.

Figure 16:
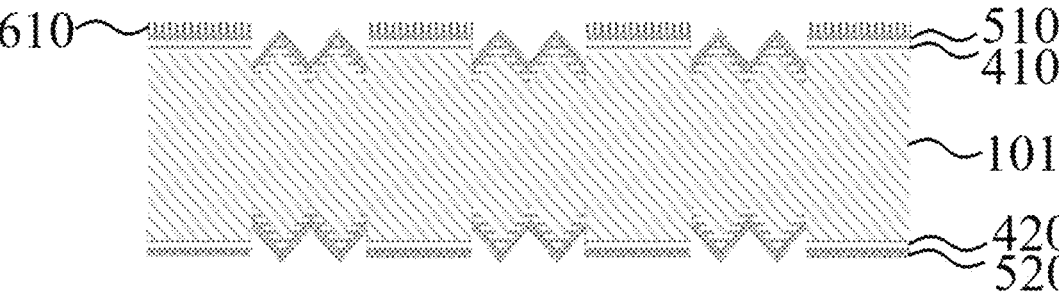
Figure 17:
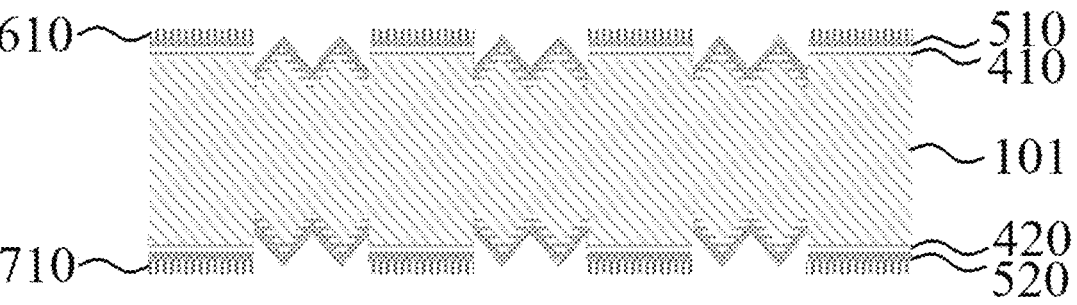

Referring to FIG. 16 and FIG. 17, a first transparent conductive film 610 is formed on part of the area on the side of the first doped semiconductor layer 510 facing away from the first smooth surface area, and the first transparent conductive film 610 is only located on the first smooth surface area; a second transparent conductive film 620 is formed on part of the area on the side of the second doped semiconductor layer 520 facing away from the second smooth surface area, and the second transparent conductive film 620 is only located on the second smooth surface area. For example, the first transparent conductive film 610 and the second transparent conductive film 620 are indium-doped tin oxide.

Specifically, the first transparent conductive film 610 is arranged opposite to the first smooth surface area, the area of the positive projection of the first transparent conductive film 610 on the textured surface area is zero. The second transparent conductive film 620 is arranged opposite to the second smooth surface area, and the area of the positive projection of the second transparent conductive film 620 on the second textured surface area is zero.

Figure 18:
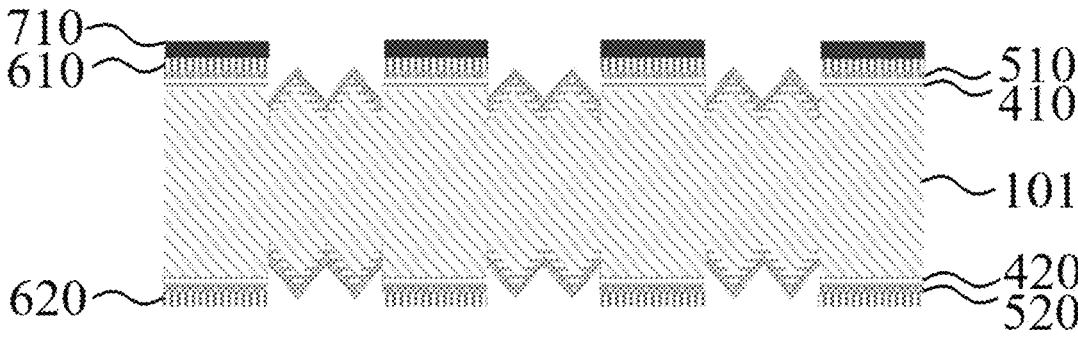
Figure 19:
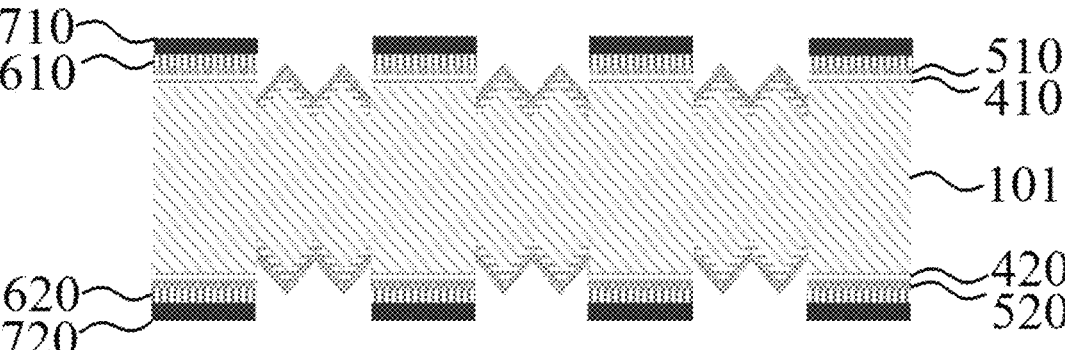

Referring to FIG. 18 and FIG. 19, a first grid line 710 is formed on one side of the first transparent conductive film 610 facing away from the first doped semiconductor layer 510; a second grid line 720 is formed on one side of the second transparent conductive film 620 facing away from the second doped semiconductor layer 520. For example, the first grid line 710 and the second grid line 720 are silver.

In other embodiments, the method for preparing a solar cell comprises: sequentially forming a first intrinsic semiconductor layer 410, a first doped semiconductor layer 510, a first transparent conductive film 610 and a first grid line 710 on one side of the semiconductor substrate 101 having a first smooth surface area 112 and a first textured surface area 111, and then forming a second intrinsic semiconductor layer 420, a second doped semiconductor layer 520, a second transparent conductive film 620 and a second grid line 720 on one side of the semiconductor substrate 101 having a second smooth surface area 122 and a second textured surface area 121.

Specifically, the method for preparing solar energy in this embodiment differs from the method for preparing solar cells in the preceding embodiments only in the order of forming each functional layer on both sides of the semiconductor substrate 101. Other parameters are the same and will not be described again here.

One or more embodiments of the present application also provides a solar cell, comprising a semiconductor substrate, wherein at least one side of the semiconductor substrate has a smooth surface area and a textured surface area adjacent to the smooth surface area, and the area of the smooth surface area is greater than or equal to that of the textured surface area; a transparent conductive film located on the side of the semiconductor substrate having the smooth surface area and the textured surface area, and only located on the smooth surface area; and a grid line located on at least part of the area of the side of the transparent conductive film facing away from the semiconductor substrate, and only located on the transparent conductive film.

In one embodiment, the semiconductor substrate comprises: a first smooth surface area located on one side of the semiconductor substrate and a first textured surface area adjacent to the first smooth surface area; and/or a second smooth surface area on the other side of the semiconductor substrate and the second textured surface area adjacent to the second smooth surface area; a doped semiconductor layer located between the semiconductor substrate and the transparent conductive film. Optionally, the solar cell further comprises: an intrinsic semiconductor layer located between the semiconductor substrate and the doped semiconductor layer. The above structure becomes an important structure for the generation of photo-generated carriers.

In a specific example of the present application, the solar cell comprises: a first intrinsic semiconductor layer and a second intrinsic semiconductor layer, wherein the first intrinsic semiconductor layer is located between the first doped semiconductor layer and the side of the semiconductor substrate having the first smooth surface area and the first textured surface area; a first doped semiconductor layer and a second doped semiconductor layer, wherein the first doped semiconductor layer is located on the side of the first intrinsic semiconductor layer facing away from the semiconductor substrate, and the second doped semiconductor layer is located on the side of the second intrinsic semiconductor layer facing away from the semiconductor substrate; a first transparent conductive film and a second transparent conductive film, wherein the first transparent conductive film is located on the side of the first doped semiconductor layer facing away from the first intrinsic semiconductor layer, and the first transparent conductive film is only located on the first smooth surface area, the second transparent conductive film is located on the side of the second doped semiconductor layer facing away from the second intrinsic semiconductor layer, and the second transparent conductive film is only located on the second smooth surface area; a first grid line and a second grid line, wherein the first grid line is located on the side of the first transparent conductive film facing away from the first doped semiconductor layer, the first grid line is only located on the first smooth surface area, and the area of the first grid line is less than or equal to that of the first transparent conductive film, the second grid line is located on the side of the second transparent conductive film facing away from the second doped semiconductor layer, the second grid line is only located on the second smooth surface area, and the area of the second grid line is less than or equal to that of the second transparent conductive film.

It can be understood that, the solar cell in the above-mentioned embodiment comprises the semiconductor substrate obtained in the previous embodiment. Therefore, the same beneficial effects as the above-mentioned semiconductor substrate can be achieved, which will not be described again here.

The solar cell of the present application will be described below in conjunction with test example and comparative example of the specific embodiments.

Test Example

A semiconductor substrate is provided, the material of the semiconductor substrate is monocrystalline silicon, the thickness is in a range from 100 μm to 180 μm, one side of the semiconductor substrate has a first smooth surface area and a first textured surface area adjacent to the first smooth surface area, and the other side of the semiconductor substrate has a second smooth surface area and a second textured surface area adjacent to the second smooth surface area. A first intrinsic semiconductor layer is formed on the side of the semiconductor substrate having the first smooth surface area and the first textured surface area, the material of the first intrinsic semiconductor layer is amorphous silicon, and the thickness is in a range from 5 nm to 10 nm; a second intrinsic semiconductor layer is formed on the side of the semiconductor substrate having the second smooth surface area and the second textured surface area, and the material of the second intrinsic semiconductor layer is amorphous silicon, and the thickness is in a range from 5 nm to 10 nm. A first doped semiconductor layer is formed on the first intrinsic semiconductor layer, and the material of the first doped semiconductor layer is N-type doped amorphous silicon and the thickness in a range from 5 nm to 15 nm; a second doped semiconductor layer is formed on the second intrinsic semiconductor layer. The material of the second doped semiconductor layer is P-type doped amorphous silicon, and the thickness is in a range from 5 nm to 15 nm. A first transparent conductive film is formed on the first doped semiconductor layer. The material of the first transparent conductive film is ITO, and the thickness is in a range from 80 nm to 100 nm. The area of the orthographic projection on the surface area is zero; a second transparent conductive film is formed on the second doped semiconductor layer, the material of the second transparent conductive film is ITO, the thickness is in a range from 80 nm to 100 nm, the second transparent conductive film and the second smooth surface area is arranged oppositely, and the area of the orthographic projection on the second textured surface area is zero. Silver paste is deposited on the first transparent conductive film to form a first grid line with a thickness ranging from 10 μm to 20 μm; and silver paste is deposited on the second transparent conductive film to form a second grid line with a thickness ranging from 10 μm to 20 μm.

Comparative Example

In this comparative example, except that both sides of the semiconductor substrate are textured, the remaining preparation method and parameters are the same as those in the Test Example.

The conversion test for photoelectric conversion performance is carried out on the solar cells prepared in the above text example and comparative example, and the data in Table 1 are obtained.

| Group | $I_{SC}$ (A) | $U_{OC}$ (V) | FF (%) | $E_{ta}$ (%) | $R_{ser}$ (Ω) | $R_{shunt}$ (Ω) |
| --- | --- | --- | --- | --- | --- | --- |
| Example | 10.8745 | 0.7410 | 86.7323 | 25.4905 | 0.00004 | 2708.3336 |
| Comparative Example | 10.8688 | 0.7401 | 85.8944 | 25.2301 | 0.00060 | 2827.4241 |

Among them, $I_{SC}$ is short circuit current; $U_{OC}$ is open-circuit voltage; FF is fill factor; $E_{ta}$ is photoelectric conversion efficiency; $R_{ser}$ is series resistance; and $R_{shunt}$ is parallel resistance.

It can be seen from the data in Table 1 that, compared to the solar cells using a traditional double-sided textured semiconductor substrate in the comparative example, the fill factor of the solar cells in the example is 0.84% higher, the short-circuit current is increased by 5 mA, the open circuit voltage is increased by 1 mV, the series resistance is decreased by 0.56 mΩ, and the photovoltaic conversion efficiency is increased by 0.2604%.

It can be seen that since the example uses a semiconductor substrate having a smooth surface area and a textured surface area on the surface, and the first grid line and the first transparent conductive film are designed to be arranged opposite to the first smooth surface area, and do not cover the first textured surface area, the second grid line and the second transparent conductive film are designed to be arranged opposite to the second smooth surface area, and do not cover the second textured surface area, so that the deposition of each functional layer is more uniform, which is conducive to reducing series resistance and improving open-circuit voltage. In addition, the contact resistance between the polished area (smooth surface area) and the metallized electrode is lower, and the series resistance ($R_{ser}$) is also significantly reduced. At the same time, it is also beneficial to improving the extraction efficiency of the first grid lines and second grid lines for photo-generated carriers, so that the short circuit current can still be increased even when the area of the textured surface area is reduced, which can ultimately improve the photovoltaic conversion efficiency of the solar cell and increase the cell efficiency.

Obviously, the above-mentioned embodiments are only examples to clearly illustrate the technical points of the present application, and are not intended to limit the implementation. For those of ordinary skill in the art, changes or modifications in other different forms can also be made on the basis of the above description. It is not necessary and impossible to exhaustively enumerate all implementations, and the obvious changes or modifications derived therefrom are still within the protection scope of the present invention.

The invention claimed is:

1. A method for treating a semiconductor substrate, wherein the method comprises:

forming a smooth surface area and a textured surface area adjacent to the smooth surface area on at least one side of the semiconductor substrate;

wherein the step of forming a smooth surface area and a textured surface area adjacent to the smooth surface area on any one side of the semiconductor substrate comprises:

forming a protective layer on a surface of any one side of the semiconductor substrate;

providing a patterned cover layer on a surface of the protective layer facing away from the semiconductor substrate, wherein the cover layer has a hollow area, and the protective layer comprises a first area located at the bottom of the hollow area and a second area covered by the cover layer;

thickening the first area of the protective layer by using the cover layer;

removing the cover layer after thickening the first area of the protective layer;

using the first area of the protective layer after removing the cover layer as a protection, removing the second area of the protective layer by etching;

performing a texture treatment on a side of the semiconductor substrate exposed by the protective layer after removing the second area, so that the textured surface area is formed on the side of the semiconductor substrate exposed by the protective layer; and removing the first area corresponding to the protective layer by etching after forming the textured surface area, so that the smooth surface area is formed on part of the surface on one side of the semiconductor substrate.

2. The method for treating a semiconductor substrate of claim 1, wherein a ratio of the area of the smooth surface area to the area of the textured surface area is in a range of 1:1 to 1.2:1.

3. The method for treating a semiconductor substrate of claim 1, wherein:

the step of forming a protective layer on the surface of any one side of the semiconductor substrate comprises:

coating an entire underlying film on any one side of the semiconductor substrate; and performing a diffusion annealing treatment on the underlying film, so that the underlying film reacts with one surface of the side of the semiconductor substrate to form the protective layer with doping ions, so that impurities inside the semiconductor substrate migrate to the protective layer.

4. The method for treating a semiconductor substrate of claim 3, wherein the step of thickening the first area of the protective layer comprises: using the cover layer as a mask, coating a top film on the surface of the first area; performing a diffusion annealing treatment to make the top film become part of the protective layer, thereby increasing the thickness of the first area.

5. The method for treating a semiconductor substrate of claim 4, wherein the underlying film and the top film are liquid source films.

6. The method for treating a semiconductor substrate of claim 4, wherein the underlying film and the top film are phosphorus-containing liquid source films, and the phosphorus concentration of the top film is greater than that of the underlying film.

7. The method for treating a semiconductor substrate of claim 4, wherein a time period for performing diffusion annealing treatment on the top film is longer than a time period for performing diffusion annealing treatment on the underlying film.

8. The method for treating a semiconductor substrate of claim 4, wherein a temperature for performing diffusion annealing treatment on the top film is greater than a temperature for performing diffusion annealing treatment on the underlying film.

9. The method for treating a semiconductor substrate of claim 1, wherein the step of thickening the first area of the protective layer comprises: using the cover layer as a mask, coating a top film on the surface of the first area; performing a diffusion annealing treatment to make the top film become part of the protective layer, thereby increasing the thickness of the first area.

10. The method for treating a semiconductor substrate of claim 1, wherein the cover layer comprises quartz material.

11. The method for treating a semiconductor substrate of claim 1, wherein:

in the steps of removing the first area of the protective layer by etching and removing the second area of the protective layer by etching, the parameters therefor comprise:

a solution used for etching being a hydrofluoric acid aqueous solution, a mixture of a hydrochloric acid aqueous solution and water solvent;

the mass concentration of the hydrofluoric acid aqueous solution being in a range from 35% to 50%;

the mass concentration of the hydrochloric acid aqueous solution being in a range from 30% to 50%;

the volume ratio of the hydrofluoric acid aqueous solution being in a range from 1% to 4%;

the volume ratio of the hydrochloric acid aqueous solution being in a range from 1% to 3%; and a time period for etching being in a range of 100 s to 300 s.

12. A method for preparing a solar cell, wherein the method comprises:

providing a semiconductor substrate;

treating the semiconductor substrate by using the method for treating a semiconductor substrate of claim 1, so that at least one side of the semiconductor substrate has a smooth surface area and a textured surface area adjacent to the smooth surface area;

forming a transparent conductive film on a side of the semiconductor substrate having a smooth surface area and a textured surface area, the transparent conductive film is located and only located on the smooth surface area; and forming a grid line on at least part of area of at least one side of the transparent conductive film facing away from the semiconductor substrate.

13. The method for preparing a solar cell of claim 12, wherein:

the method also comprises:

forming a doped semiconductor layer on the side of the semiconductor substrate having the smooth surface area and the textured surface area before forming the transparent conductive film, wherein the doped semiconductor layer is located between the semiconductor substrate and the transparent conductive film.

\* \* \* \* \*